(12) United States Patent
Hong

(10) Patent No.: US 9,105,312 B2
(45) Date of Patent: Aug. 11, 2015

(54) SENSE AMPLIFIER

(71) Applicant: TAIWAN SEMICONDUCTOR MANUFACTURING COMPANY, LTD., Hsinchu (TW)

(72) Inventor: Hyun-Sung Hong, Kanata (CA)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/177,604

(22) Filed: Feb. 11, 2014

(65) Prior Publication Data

US 2014/0159820 A1   Jun. 12, 2014

Related U.S. Application Data

(62) Division of application No. 13/399,834, filed on Feb. 17, 2012, now Pat. No. 8,680,890.

(51) Int. Cl.
| | |
|---|---|
| *G01R 19/00* | (2006.01) |
| *G11C 7/06* | (2006.01) |
| *H03F 3/16* | (2006.01) |
| *G11C 7/12* | (2006.01) |
| *G11C 11/4091* | (2006.01) |
| *G11C 11/4094* | (2006.01) |

(52) U.S. Cl.
CPC ........ *G11C 7/06* (2013.01); *G11C 7/065* (2013.01); *G11C 7/12* (2013.01); *G11C 11/4091* (2013.01); *G11C 11/4094* (2013.01); *H03F 3/16* (2013.01); *G11C 2207/002* (2013.01)

(58) Field of Classification Search
USPC ............ 327/51, 52, 54, 55, 57; 365/203, 205, 365/207, 208
See application file for complete search history.

(56) References Cited

U.S. PATENT DOCUMENTS

| | | | | |
|---|---|---|---|---|
| 6,794,915 | B2 * | 9/2004 | Goldgeisser et al. | 327/208 |
| 7,262,639 | B2 * | 8/2007 | Mulder et al. | 327/65 |
| 8,680,890 | B2 * | 3/2014 | Hong | 327/52 |
| 2004/0125643 | A1 * | 7/2004 | Kang et al. | 365/148 |

* cited by examiner

*Primary Examiner* — Long Nguyen
(74) *Attorney, Agent, or Firm* — Lowe Hauptman & Ham, LLP

(57) ABSTRACT

A sense amplifier circuit includes a first transistor, a second transistor, a third transistor, a fourth transistor, a fifth transistor, a sixth transistor, a first resistive device, and a second resistive device. The first resistive device is coupled to a first data line and to a drain of the third transistor. The second resistive device is coupled to a second data line and to a drain of the fourth transistor. A terminal of the fifth transistor is coupled to the gate of the first transistor. A terminal of the sixth transistor is coupled to the gate of the second transistor.

20 Claims, 19 Drawing Sheets

SENSE AMPLIFIER

PRIORITY CLAIM

The present application is a divisional of U.S. application Ser. No. 13/399,834, filed Feb. 17, 2012, now U.S. Pat. No. 8,680,890, which is incorporated herein by reference in its entirety.

FIELD

The present disclosure is related to a sense amplifier.

BACKGROUND

In some existing approaches, sense amplifiers that use half operational voltage VDD as a pre-charge voltage do not work well in some conditions, such as when the operational voltage VDD is low and/or the threshold voltage of transistors in the sense amplifiers are high. The term "pre-charge" is commonly used to refer to charging signals before reading from or writing to a memory cell.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
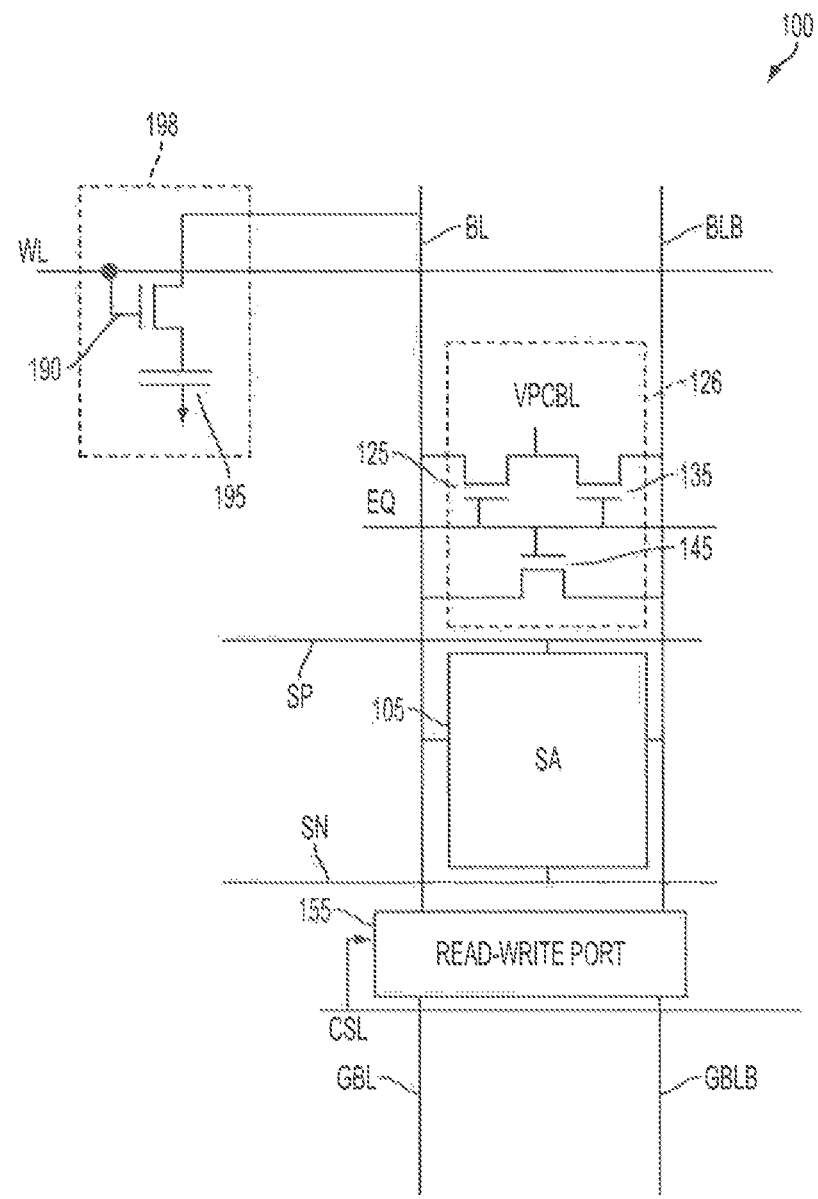
FIG. 1 is a diagram of a memory circuit, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. The performance of sense amplifiers that use half of operational voltage VDD as a pre-charge voltage is improved. For example, in some embodiments, the sense amplifiers operate at a wider operational voltage range. The improvement is realized at low operational voltages VDD and/or high threshold voltage Vt conditions. Vt is the threshold voltage of transistors in the sense amplifiers.

Exemplary Memory Circuit

FIG. 1 is a diagram of a memory circuit 100, in accordance with some embodiments.

Memory cell unit 198 includes a memory pass gate transistor 190 and a memory cell 195. The memory pass gate transistor 190 allows access between a local sense amplifier 105 and memory cell 195 through the pair of bit lines BL and BLB. In some embodiments, each of bit lines BL and BLB is connected to an equal number of memory cell units 198, but only one memory cell unit 198 connected to bit line BL is shown in FIG. 1 for illustration. In some embodiments, memory cell 195 is a capacitor storing charges. When memory cell 195 is electrically connected to bit line BL as shown in FIG. 1, memory cell 195 shares the same charge with bit line BL. Depending on the charge representing the logical value of memory cell 195, bit line BL is pulled one way or another. For example, if memory cell 195 stores a logical low value, bit line BL is pulled towards ground or reference voltage VSS. Conversely, if memory cell 195 stores a high logical value, bit line BL is pulled towards operational voltage VDD. After memory cell 195 and bit line BL are electrically coupled together, a bit line split or the voltage difference between bit line BL and bit line BLB starts to develop.

Bit lines BL and BLB serve as both data input and output for memory cell 195 and for sense amplifier 105, and are commonly called data lines. In some embodiments, in a write cycle, applying a logical value to a first bit line, and the opposite logical value to the other bit line, enables writing the logical value at the first bit line to memory cell 195. In a read cycle, sensing or reading the logical values at bit lines BL and BLB reveals the data stored in memory cell 195. For example, once the bit line split is sufficiently large, sense amplifier 105 amplifies the bit line split, providing a full swing signal on bit lines BL and BLB that represents the data to be read from memory cell 195. For another example, if memory cell 195 stores a logical high value, sensing bit line BL reveals a high logical value. Conversely, if memory cell 195 stores a logical low value, sensing bit line BL reveals a logical low value. In some embodiments, a logical low value for a full swing signal is at reference voltage VSS while a logical high value for a full swing signal is at operational voltage VDD.

Word line WL is used to turn on or off memory pass gate transistor 190 to allow access to memory cell 195 through memory pass gate transistor 190. In FIG. 1, memory cell unit 198 is electrically coupled to bit line BL for illustration. Depending on implementation in a memory array, some memory cell units 198 are connected to bit line BL while some other memory cell units 198 are connected to bit line BLB. In FIG. 1, when word line WL at the gate of memory pass gate transistor 190 is applied with a logical low value, transistor 190 is turned off. The corresponding memory cell 195 is therefore electrically disconnected from bit line BL or from sense amplifier 105. When word line WL is applied with a logical high value, however, memory pass gate transistor 190 is turned on. The corresponding memory cell 195 is electrically connected to bit line BL. In some embodiments, the high logical value of word line WL is called voltage VPP, which is 1.5 V, and the low logical value of word line WL is called voltage VBB, which is −0.5 V.

Pre-charge and equalization (PCEQ) circuit 126 includes transistors 125, 135, and 145 that, together with signal EQ, are used to pre-charge and equalize bit lines BL and BLB. For example, when signal EQ is applied with a high logical value, transistors 125, 135, and 145 are turned on, enabling bit lines BL and BLB to be at the same voltage level VPCBL at the drains of transistors 125 and 135. Stated differently, bit lines BL and BLB are pre-charged and equalized to voltage VPCBL. The term "pre-charge" is commonly used to refer to charging before reading and/or writing memory cell 195. A circuit similar to circuit 126 is used to pre-charge and equalize signals SP and SN. For simplicity, however, the circuit is not shown, and should be recognizable by persons of ordinary skill in the art.

Signals SP and SN are used to turn on or off sense amplifier 105. Signal SP is commonly called the positive supply voltage while signal SN is commonly called the negative supply voltage, even though signal SN has a positive voltage in many situations. In general, when signals SP and SN are at a same voltage level, amplifier 105 is turned off. In some embodiments, both signals SP and SN are set at half of voltage VDD to turn off sense amplifier 105. In contrast, when signal SP is at an operational voltage VDD and signal SN is at a reference voltage level VSS, sense amplifier 105 is turned on.

Local sense amplifier 105 is used to sense the data on bit lines BL and BLB. When a bit line split of bit lines BL and BLB is sufficiently developed, sense amplifier 105 is turned on to sense or amplify the bit line split and generate a full swing signal on local bit lines BL and BLB that represent the data read from memory cell 195. In some embodiments, after sensing, sense amplifier 105 also restores the read data to memory cell 195, and sends the data on bit lines BL and BLB to the corresponding global bit lines GBL and GBLB. In some embodiments, sense amplifier 105 is turned on when the bit line split reaches a predetermined voltage value, which varies depending on various factors, such as the technology node, the ability of sense amplifier 105 to sense or differentiate the voltage levels of bit lines BL and BLB, etc.

Column select signal CSL and read-write port 155 enable the data transfer between the pair of local bit lines BL and BLB and the corresponding pair of global bit lines GBL and GBLB.

The Sense Amplifier

Figure 2:
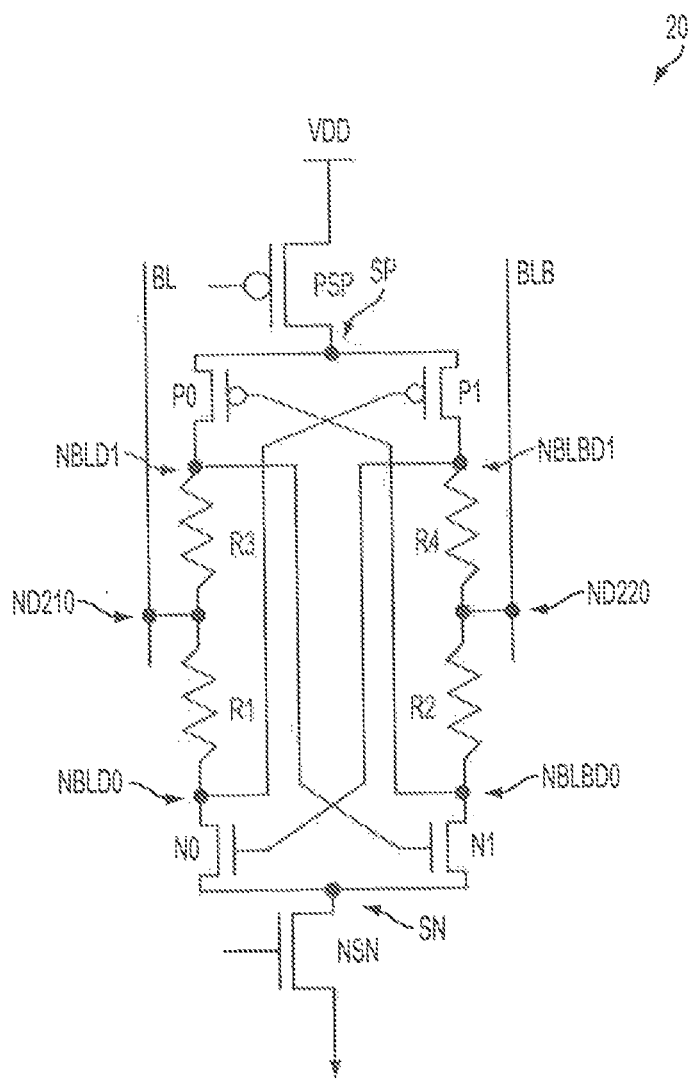
FIG. 2 is diagram of the sense amplifier in FIG. 1, in accordance with some embodiments.

FIG. 2 is a diagram of a sense amplifier circuit 200 illustrating an implementation of sense amplifier 105, in accordance with some embodiments. For illustration, the voltage dropped across the gate and the source of transistors P0, P1, N0, and N1 is called voltage VGSP0, VGSP1, VGSN0, and VGSN1, respectively. The voltage on bit line BL and bit line BLB is called voltage VBL and voltage VBLB, respectively. The saturation currents of respective transistors P0, P1, N0, and N1 to keep transistors P0, P1, N0, and N1 in the saturation mode are called currents IDSP0, IDSP1, IDSN0, and IDSN1, respectively. The currents following through resistors R1, R2, R3, and R4 are called currents IR1, IR2, IR3, and IR4, respectively. To avoid obscuring the drawing, currents IR1, IR2, IR3, and IR4 are not shown.

P-channel metal-oxide semiconductor (PMOS) transistor PSP provides operational voltage VDD to signal SP. For example, when transistor PSP is turned on, signal SP at the drain of transistor PSP is pulled to operational voltage VDD at the source of transistor PSP. N-channel metal-oxide semiconductor (NMOS) transistor NSN provides reference voltage VSS or ground to signal SN. For example, when transistor NSN is turned on, signal SN at the drain of transistor NSN is pulled to voltage VSS at the source of transistor NSN.

Nodes ND210 and ND220 serve as inputs and outputs for sense amplifier 200. Node ND210 is coupled to bit line BL, a first end of resistor R1, and a first end of resistor R3. Node ND220 is coupled to bit line BLB, a first end of transistor R2, and a first end of resistor R4.

Node NBLD0 is at the drain of NMOS transistor N0 and a second end of resistor R1. Node NBLBD0 is at the drain of NMOS transistor N1 and a second end of resistor R2. Node NBLD1 is at the drain of PMOS transistor P0 and a second end of resistor R3. Node NBLBD1 is at the drain of PMOS transistor P1 and a second end of resistor R4. For illustration, the voltage at nodes NBLD0, NBLBD0, NBLD1, and NBLBD1 are called voltages VBLD0, VBLBD0, VBLD1, and VBLBD1, respectively. To avoid obscuring the drawing, voltages VBLD0, VBLBD0, VBLD1, and VBLBD1 are not shown.

PMOS transistors P0 and P1 and NMOS transistors N0 and N1 provide the sensing function for sense amplifier 200. In some embodiments, sense amplifier 200, through transistors P0, P1, N0, and N1, senses the bit line split of bit lines BL and BLB at nodes ND210 and ND220, respectively.

Resistors R1 and R2 are configured to carry currents and increase the voltage at the gates of transistors P1 and P0, respectively. Because the voltage at the sources of transistors P1 and P0 are at a predefined voltage level of operational voltage VDD, each of the corresponding voltage VGSP1 and voltage VGSP0 dropped across the gate and the source of corresponding transistors P1 and P0 increases. For example, resistor R1 causes a voltage drop across resistor R1, which is the voltage dropped across node ND210 and the drain of transistor N0 or the gate of transistor P1. As a result, voltage VBLD0 at node NBLD0 is less than voltage VBL at node ND210 or at bit line BL. Effectively, the absolute value |VBLD0| of voltage VBLD0 decreases and the absolute value |VGSP1| of voltage VGSP1 increases. For another example, voltage VBLD0 is the voltage at the gate of transistor P1. When sense amplifier 200 is turned on, the voltage at the source of transistor P1 or the voltage of signal SP is voltage VDD. As a result, voltage VGSP1 dropped between the gate and the source of transistor P1 is VBLD0−VDD. When bit line BL is pre-charged to voltage VPCBL at ½ VDD, VBLD0<½ VDD. As a result, |VBLD0−VDD|>|½ VDD| or |VGSP1|>|1;2 VDD|. In some existing approaches in which there is no resistor R1, the absolute value |VGSP1| of voltage VGSP1 of transistor P1 is about ½ VDD. Current IDSP1 in the illustration of FIG. 2 therefore increases compared with that of the existing approaches, and PMOS transistor P1 conducts stronger. Consequently, various embodiments of the disclosure are advantageous over the existing approaches.

For another example, resistor R2 causes a voltage drop across resistor R2, which is the voltage dropped across node ND220 and the drain of transistor N1 or the gate of transistor P0. As a result, voltage VBLBD0 at node NBLBD0 is less than voltage VBLB at node ND220 or at bit line BLB. Effectively, the absolute value |VBLBD0| of voltage VBLBD0 decreases and the absolute value |VGSP0| of voltage VGSP0 increases. For another example, voltage VBLBD0 is the voltage at the gate of transistor P0. When sense amplifier 200 is turned on, the voltage at the source of transistor P0 or the voltage of signal SP is voltage VDD. As a result, voltage VGSP0 dropped between the gate and the source of transistor P0 is VBLBD0−VDD. When bit line BLB is pre-charged to ½ VDD, VBLBD0<½ VDD. As a result, |VBLBD0−VDD|>|½ VDD| or |VGSP0|>|½ VDD|. In some existing approaches in which there is no resistor R2, |VGSP0| of transistor P0 is about ½ VDD. Current IDSP0 in the illustration of FIG. 2 therefore increases compared with that of the existing approaches, and PMOS transistor P0 conducts stronger. Consequently, various embodiments of the disclosure are advantageous over the existing approaches.

Resistors R3 and R4 are configured to carry currents and increase the voltage at the gates of transistors N1 and N0, respectively. Because the voltage at the sources of transistors N1 and N0 are at a predefined voltage level, such as operational voltage VSS, each of the corresponding voltage VGSN1 and voltage VGSN0 dropped across the gate and the source of corresponding transistor N1 and N0 increases. For example, resistor R3 causes a voltage drop across resistor R3, which is the voltage dropped across node ND210 and the drain of transistor P0 or the gate of transistor N1. As a result, voltage VBLD1 at node NBLD1 is higher than voltage VBL at node ND210 or at bit line BL. Effectively, voltage VBLD1 increases and voltage VGSN1 increases. For another example, voltage VBLD1 is the voltage at the gate of transistor N1. When sense amplifier 200 is turned on, the voltage at the source of transistor N1 or the voltage of signal SN is voltage VSS. As a result, voltage VGSN1 dropped between the gate and the source of transistor N1 is VBLD1–VSS. When bit line BL is pre-charged to voltage VPCBL at ½ VDD, VBLD1>½ VDD. As a result, VBLD1–VSS>½ VDD or VGSN1>½ VDD. In some existing approaches in which there is no resistor R3, voltage VGSN1 of transistor N1 is about ½ VDD. Current IDSN1 in the illustration of FIG. 2 therefore increases compared with that of the existing approaches, and NMOS transistor N1 conducts stronger. Consequently, various embodiments of the disclosure are advantageous over the existing approaches.

For another example, resistor R4 causes a voltage dropped across resistor R4, which is the voltage dropped across node ND220 and the drain of transistor P1 or the gate of transistor N0. As a result, voltage VBLBD1 at node NBLBD1 is higher than voltage VBLB at node ND220 or at bit line BLB. Effectively, voltage VBLBD1 increases and voltage VGSN0 increases. For another example, voltage VBLBD1 is the voltage at the gate of transistor N0. When sense amplifier 200 is turned on, the voltage at the source of transistor N0 or the voltage of signal SN is voltage VSS. As a result, voltage VGSN0 dropped between the gate and the source of transistor N0 is VBLBD1–VSS. When bit line BLB is pre-charged to ½ VDD, VBLBD1>½ VDD. As a result, VBLBD1–VSS>½ VDD or VGSN0>½ VDD. In some existing approaches in which there is no resistor R4, VGSN0 of transistor N0 is about ½ VDD. Current IDSN0 in the illustration of FIG. 2 therefore increases compared with that of the existing approaches, and NMOS transistor N0 conducts stronger. Consequently, various embodiments of the disclosure are advantageous over the existing approaches.

The resistance value for each of resistors R1, R2, R3, and R4 varies depending on the technology node. In some embodiments, the resistance value for each of resistors R1, R2, R3, and R4 is determined by simulation. For example, a change in the corresponding voltages VGSP1, VGSP0, VGSN1, and VGSN0 is determined. The voltage at each of nodes ND210 and ND220 is observed, and the resistance value of each of resistors R1, R2, R3, and R4 is adjusted and selected.

Resistors R1, R2, R3, and R4 are used for illustration. Other circuits or devices that limit corresponding currents IDSP0, IDSP1, IDSN0, and IDSN1 and/or change the gate voltage of corresponding transistors P1, P0, N1, and N0 to change corresponding voltages VGSP1, VGSP0, VGSN1, and VGSN0 are within the scope of various embodiments.

Exemplary Waveforms

Figure 3:
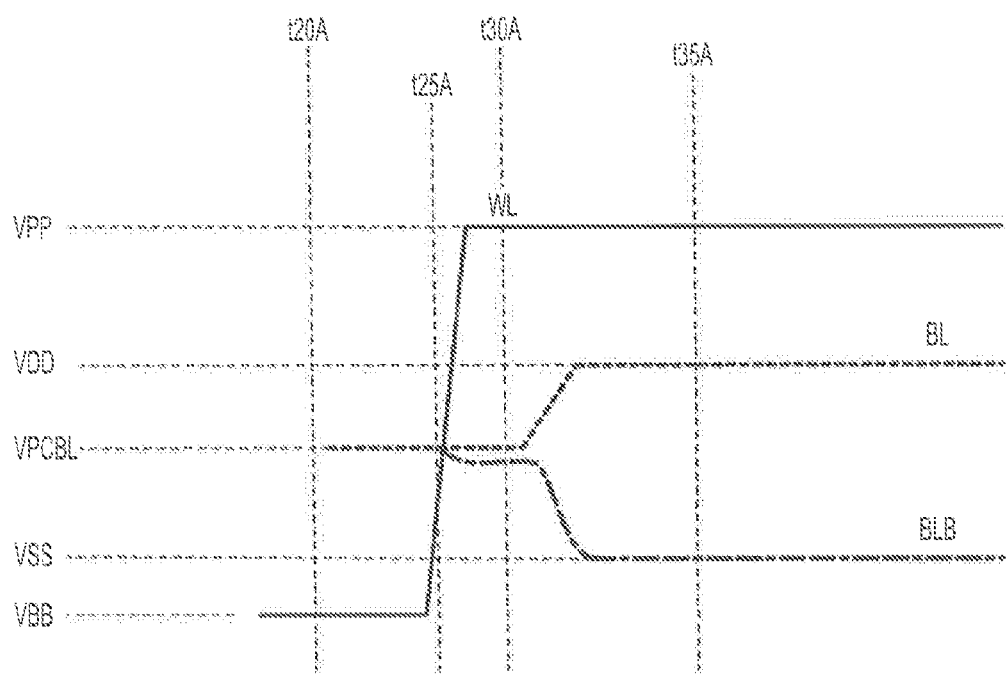
FIG. 3 is a graph of waveforms illustrating the operation of the memory circuit in FIG. 1, in accordance with some embodiments.

FIG. 3 is a graph of waveforms illustrating an operation of memory circuit 100, in accordance with some embodiments. In the illustration with reference to FIG. 3, some signals are mentioned, but, to avoid obscuring the graph, the waveforms for the signals are not shown. The low and the high voltage values for word line WL is voltage VBB and VPP, respectively, which, in some embodiments, are –0.5 V and 1.5 V, respectively. The low and the high voltage values for both bit lines BL and BLB are reference voltage VSS and operational VDD, which, in some embodiments, are 0 V and 0.85 V, respectively. The pre-charge level for signals SP and SN and bit lines BL and BLB is voltage VPCBL, which, in some embodiments, is half of operational voltage VDD.

Between times t20A and t25A, signals SP and SN, and bit lines BL and BLB are pre-charged and equalized to voltage VPCBL. In some embodiments signal EQ is activated with a logical high value to pre-charge and equalize signals SP and SN, and bit lines BL and BLB.

At time t25A, after the pre-charge and equalization are complete, word line WL is activated with a logical high value. As a result, memory cell 195 in FIG. 1 is electrically coupled to bit line BL. The bit line split between bit lines BL and BLB at the corresponding nodes ND210 and ND220 therefore starts to develop. In FIG. 3, for illustration, bit line BLB is pulled down towards reference voltage VSS while bit line BL stays at the same level.

At time t30A, the bit line split develops sufficiently for sense amplifier 105 to be turned on. In some embodiments, to turn on sense amplifier 105, signal SP is pulled towards operational voltage VDD and signal SN is pulled towards reference voltage VSS. After sense amplifier 105 is turned on, the bit line split continues to enlarge. Effectively, bit line BL is pulled towards operational voltage VDD while bit line BLB continues to be pulled towards reference voltage VSS.

At time t35A, after bit lines BL and BLB reach the full swing signals, the data on bit lines BL and BLB are processed accordingly, depending on whether the operation is a read or a write operation. For example, if the operation is a read operation, the data on bit lines BL and BLB are transferred to the corresponding global bit lines GBL and GBLB to be sent to other circuits outside of circuit 100. In contrast, if the operation is a write operation, the data on bit lines BL and BLB are written to the corresponding memory cell, such as memory cell 195 in circuit 100. In some embodiments, a write back occurs after reading. For example, after the data in memory cell 195 causes the bit line split as explained above, the data on bit lines BL and BLB, in addition to being sent to global bit lines GBL and GBLB for reading, are also written back to memory cell 195.

Some embodiments are advantageous because each of voltages VGSP1, VGSP0, VGSN1, and VGSN0 increases, and each of transistors P1, P0, N1, and N0 conducts strongly. As a result, when each of bit lines BL and BLB transitions from a high to a low logical value or vice versa, the rise and the fall time of bit lines BL and BLB are improved.

The Sense Amplifier—Embodiments Using Resistors

In FIG. 2, resistors R1 and R2 are configured to increase voltages VGSP1 and VGSP0, respectively. Similarly, resistors R3 and R4 are configured to increase voltages VGSN1 and VGSN0, respectively. In some embodiments, either the pair of voltages VGSP1 and VGSP0 or the pair of voltages VGSN1 and VGSN0 is increased.

Figure 4:
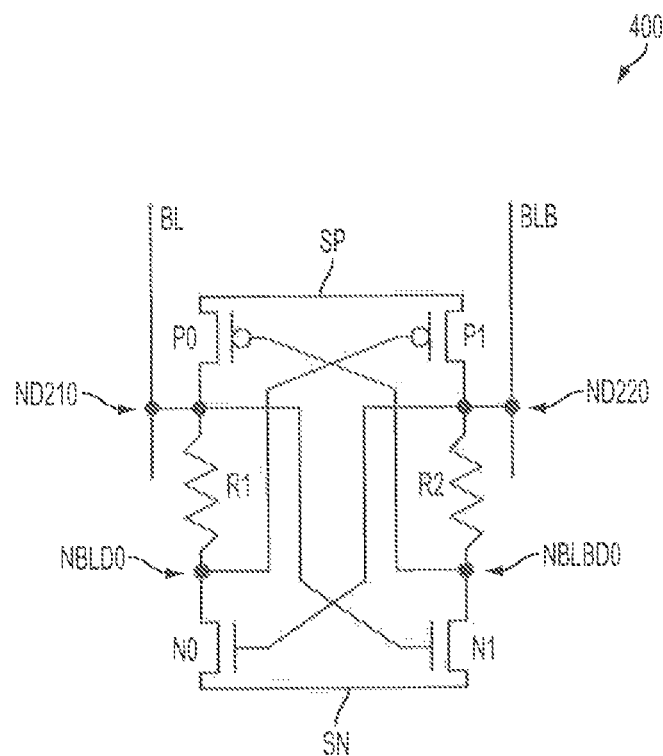
FIGS. 4-17 are diagrams of different embodiments of the sense amplifier in FIG. 1.

FIG. 4 is a diagram of a sense amplifier circuit 400, in accordance with some embodiments. Circuit 400 is another embodiment of sense amplifier circuit 105 in FIG. 1. In some embodiments, each of circuit 400-1700 in FIGS. 4-17 includes PMOS transistor PSP and NMOS transistor NSN. For simplicity, however, transistors PSP and NSN are not shown in each circuit 400-1700.

Compared with circuit 200, circuit 400 does not include resistors R3 and R4. As a result, the first end of resistor R1 is coupled to node ND210, the drain of transistor P0, and the gate of transistor N1. Similarly, the first end of resistor R2 is coupled to node ND220, the drain of transistor P1, and the gate of transistor N0. Effectively, resistors R1 and R2 increase voltages VGSP1 and VGSP0, respectively, compared with the situations in which sense amplifier circuit 400 does not include resistors R1 and R2.

Figure 5:
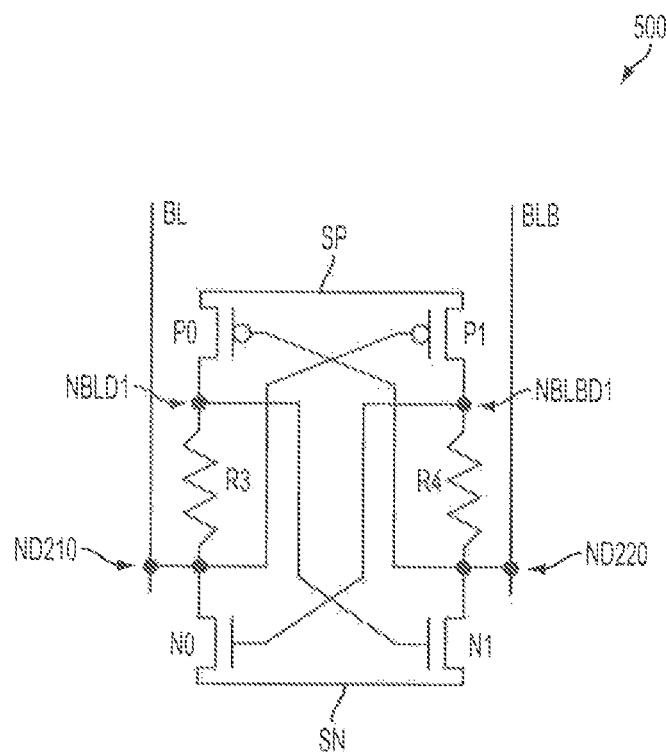

FIG. 5 is a diagram of a sense amplifier circuit 500, in accordance with some embodiments. Circuit 500 is another embodiment of sense amplifier circuit 105 in FIG. 1.

Compared with circuit 200, circuit 500 does not include resistors R1 and R2. As a result, the first end of resistor R3 is coupled to node ND210, the drain of transistor N0, and the gate of transistor P1. Similarly, the first end of resistor R4 is coupled to node ND220, the drain of transistor N1, and the gate of transistor P0. Effectively, resistors R3 and R4 increase voltages VGSN1 and VGSN0, respectively, compared with the situation in which sense amplifier circuit 400 does not include resistors R3 and R4.

Sense Amplifiers—Embodiments Having MOS Transistors

Figure 6:
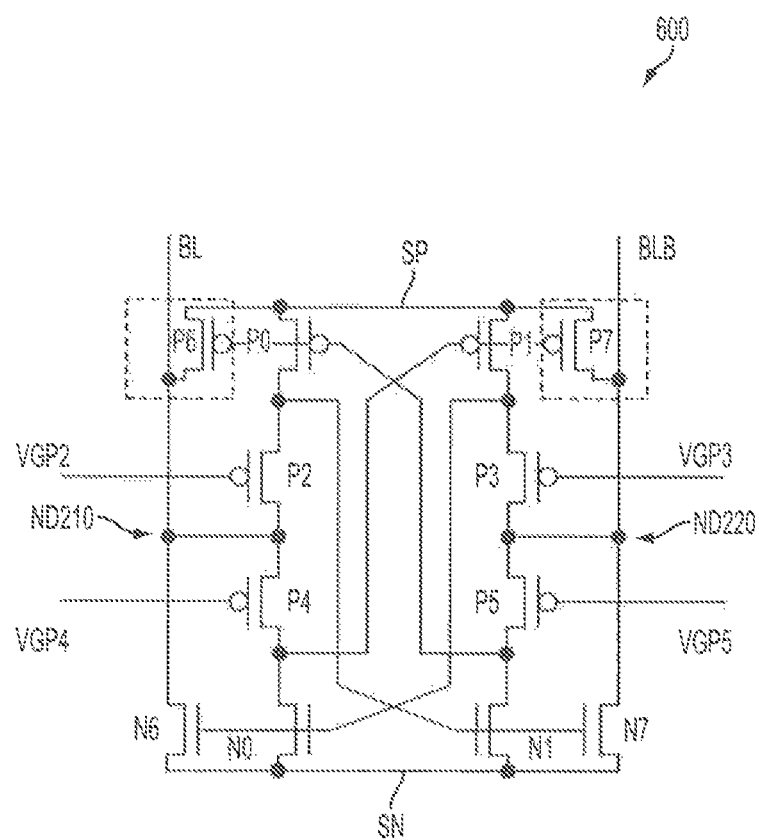

FIG. 6 is a diagram of a sense amplifier circuit 600, in accordance with some embodiments. Circuit 600 is another embodiment of sense amplifier circuit 105 in FIG. 1.

Compared with circuit 200, PMOS transistors P2, P3, P4, and P5 in circuit 600 are used in place of resistors R3, R4, R1, and R2 in circuit 200, respectively. Circuit 600 also includes additional NMOS transistors N6 and N7 and PMOS transistors P6 and P7.

For illustration, the current from the drain to the source of each transistor P2, P3, P4, and P5 is called IDSP2, IDSP3, IDSP4, and IDSP5, respectively. Each of voltages VGP2, VGP3, VGP4, and VGP5 is used to control the corresponding currents IDSP2, IDSP3, IDSP4, and IDSP5. In some embodiments, each voltage VGP2, VGP3, VGP4, and VGP5 is adjusted such that each of currents IDSP2, IDSP3, IDSP4, and IDSP5 equals to each of currents IR3, IR4, IR1, and IR2 in FIG. 2, respectively. Effectively, transistors P2, P3, P4, and P5 function in the same manner as corresponding resistors R3, R4, R1, and R2 in terms of the currents flowing through the corresponding transistors P2, P3, P4, and P5. Explained in a different way, the effective impedance of transistors P2, P3, P4, and P5 correspond to the effective impedance of the corresponding resistors R3, R4, R1, and R2.

The drain of NMOS transistor N6 is coupled to node ND210 and bit line BL. The source of transistor N6 is coupled to the sources of NMOS transistors N0, N1, and N7, and configured to receive signal SN. The gate of transistor N6 is coupled to the gate of transistor N0, the drain of transistor P1, and the source of transistor P3. The drain of NMOS transistor N7 is coupled to node ND220 and bit line BLB. The source of transistor N7 is coupled to the sources of transistors N1, N0, and N6, and configured to receive signal SN. The gate of transistor N7 is coupled to the gate of transistor N1, the drain of transistor P0, and the source of transistor P2.

NMOS transistors N6 and N7 are configured such that each of the corresponding bit lines BL and BLB is pulled to voltage VSS of signal SN at the source of transistors N6, N0, N1, and N7. For example, without transistor N6, when PMOS transistor P4 and NMOS transistor N0 are turned on, node ND210 or the source of PMOS transistor P4 is pulled towards voltage VSS at the source of NMOS transistor N0 through PMOS transistor P4 and NMOS transistor N0. In some conditions, because the PMOS transistor P4 is in between node ND210, NMOS transistor N0, and voltage VSS, node ND210 is not pulled to voltage VSS. Having transistor N6, however, when transistor N6 is turned on, node ND210 or bit line BL is pulled to voltage VSS at the source of transistor N6.

Similarly, without transistor N7, when PMOS transistor P5 and NMOS transistor N1 are turned on, node ND220 or the source of PMOS transistor P5 is pulled towards voltage VSS at the source of transistor N1 through PMOS transistor P5 and NMOS transistor N1. In some conditions, because PMOS transistor P5 is in between node ND220, NMOS transistor N1, and voltage VSS, node ND220 is not pulled to voltage VSS. Having transistor N7, however, when transistor N7 is turned on, node ND220 or bit line BLB is pulled to voltage VSS at the source of transistor N7.

PMOS transistors P6 and P7 are configured such that each of the corresponding bit lines BL and BLB is pulled to voltage VDD of signal SP at the source of transistors P6, P0, P1, and P7. For example, when transistor P6 is turned on, node ND210 or bit line BL is pulled to voltage VDD at the source of transistor P6. Similarly, when transistor P7 is turned on, node ND220 or bit line BLB is pulled to voltage VDD at the source of transistor P7. Each of transistors P6 and P7 is shown in a dotted box to indicate that, in various embodiments, transistors P6 and P7 are not used. In such a situation, PMOS transistors P2 and P0 operate in place of transistor P6 to pull node ND210 to voltage VDD. For example, when PMOS transistors P4 and P2 are turned on, node ND210 at the drain of transistor P2 is pulled to voltage VDD of signal SP at the source of PMOS transistor P0. Similarly, transistors P3 and P1 operate in place of transistor P7 to pull node NS220 to voltage VDD. For example, when PMOS transistors P3 and P1 are turned on, node ND220 at the drain of transistor P3 is pulled to voltage VDD of signal SP at the source of PMOS transistor P1.

In FIG. 6, both pairs of transistors P4 and P5, and P2 and P3 are used to affect voltages VGSP1 and VGSP0, and voltages VGSN1 and VGSN0, respectively. In some embodiments, either the pair of transistors P4 and P5 or the pair of transistor P2 and P3 is used.

Figure 7:
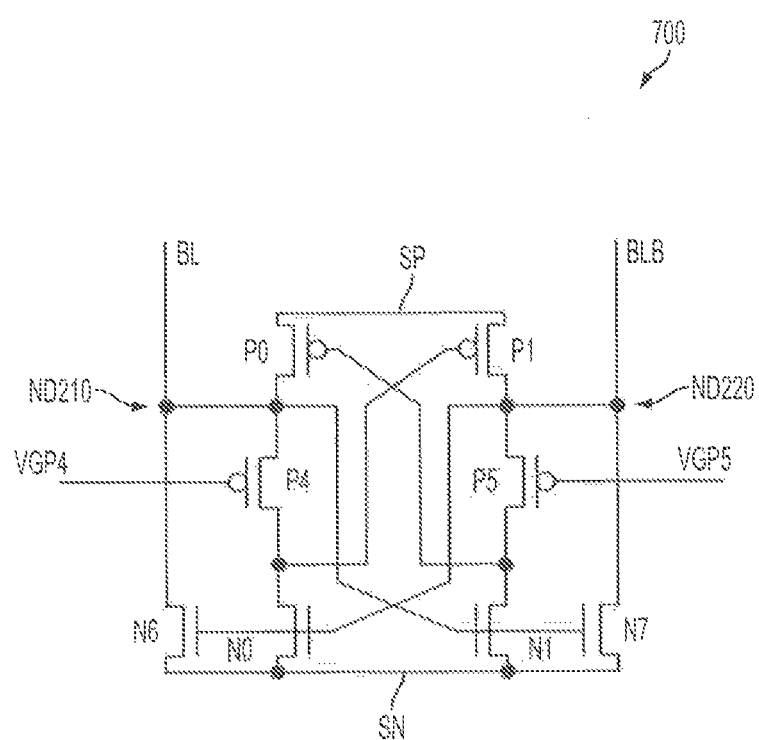

FIG. 7 is a diagram of a sense amplifier circuit 700, in accordance with some embodiments. Circuit 700 is another embodiment of sense amplifier circuit 105 in FIG. 1.

Compared with circuit 600, circuit 700 does not include transistors P2 and P3. As a result, node ND210 is coupled to bit BL, the drain of transistors P0, the source of transistor P4, and the gates of transistors N1 and N7. Similarly, node ND220 is coupled to bit BLB, the drain of transistors P1, the source of transistor P5, and the gates of transistors N0 and N6. Effectively, PMOS transistors P4 and P5 increase voltages VGSP1 and VGSP0 of respective transistors P1 and P0.

Figure 8A:
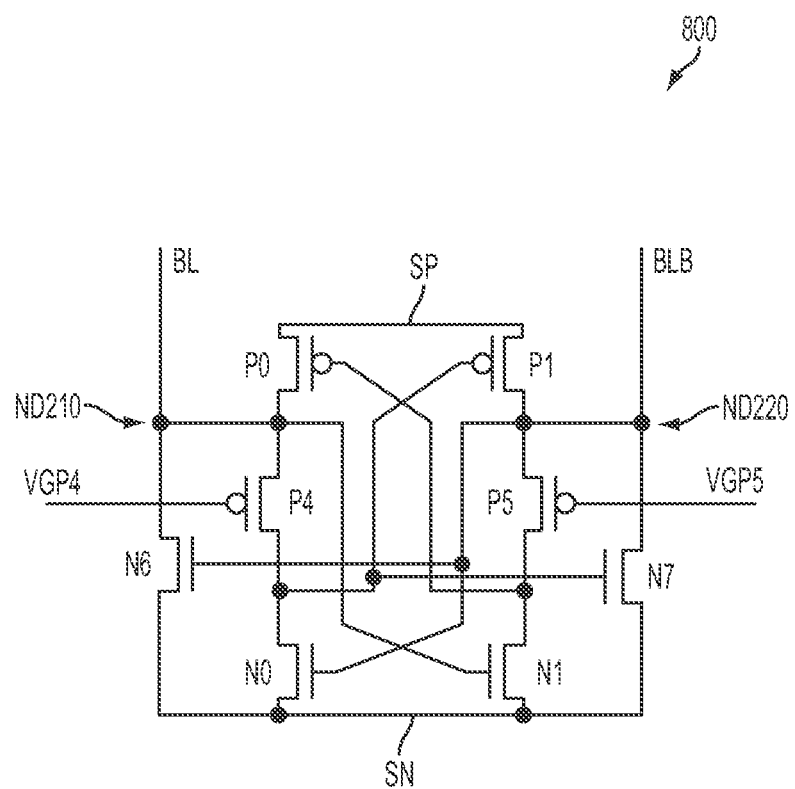

FIG. 8A is a diagram of a sense amplifier circuit 800, in accordance with some embodiments. Circuit 800 is another embodiment of sense amplifier circuit 105 in FIG. 1.

Compared with circuit 700, NMOS transistor N6 in circuit 800 is coupled to other circuit elements in a different way than NMOS transistor N6 in circuit 700 being coupled to other circuit elements. For example, the gate of transistor N6 in FIG. 8A is coupled to the gate of transistor P0, the drain of transistor N1, and the drain of transistor P5. Functionally, transistor N6 in FIG. 8A is also to pull node ND210 to voltage VSS of signal SN at the source of transistor N6. Similarly, compared with circuit 700, NMOS transistor N7 in circuit 800 is coupled to other circuit elements in a different way than NMOS transistor N7 in circuit 700 being coupled to other circuit elements. For example, the gate of transistor N7 in FIG. 8A is coupled to the gate of transistor P1, the drain of transistor N0, and the drain of transistor P4. Functionally, transistor N7 in FIG. 8A is also to pull node ND220 to voltage VSS of signal SN at the source of transistor N7.

Figure 8B:
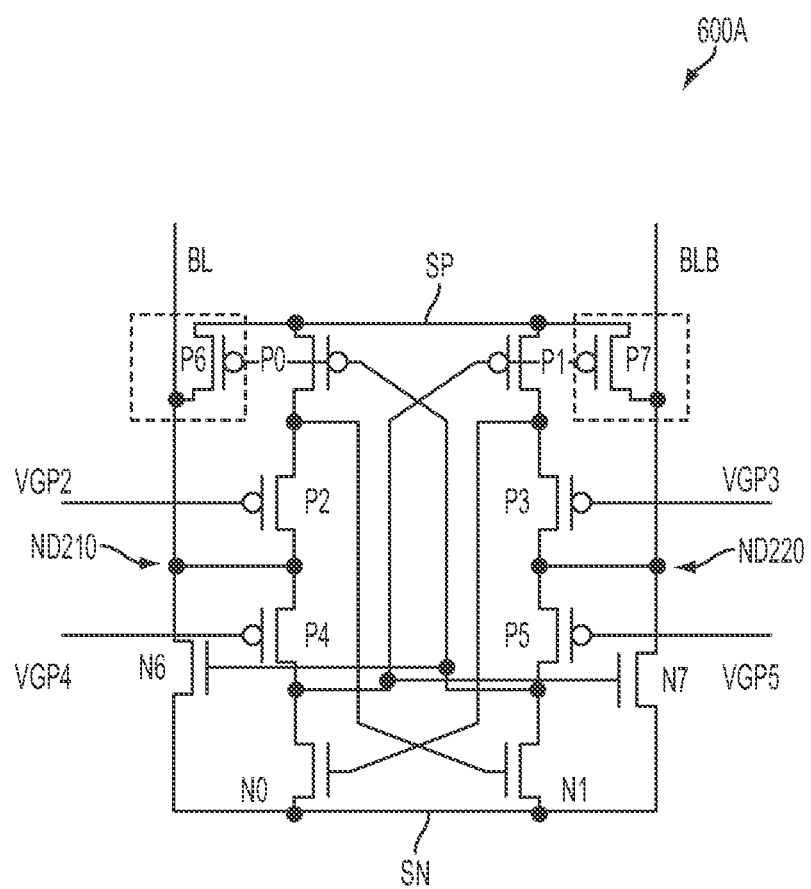

In some embodiments, the configurations of transistors N6 and N7 in FIG. 8A are also used to replace the configurations of transistors N6 and N7 in circuit 600 of FIG. 6. A diagram of an example sense amplifier 600A, which is based on modifying circuit 600 of FIG. 6 according to this paragraph, is shown in FIG. 8B.

Figure 9:
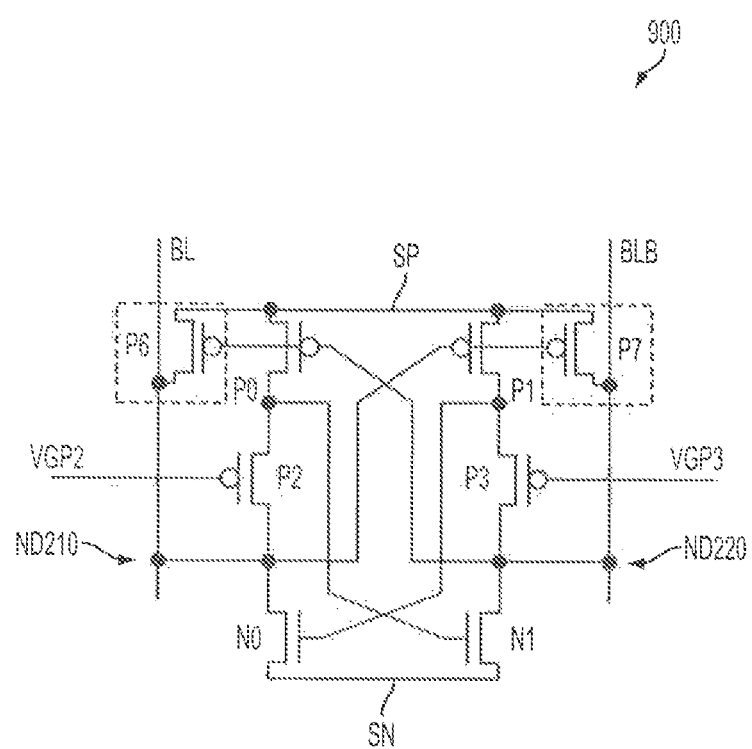

FIG. 9 is a diagram of a sense amplifier circuit 900, in accordance with some embodiments. Circuit 900 is another embodiment of sense amplifier circuit 105 in FIG. 1.

Compared with circuit 600, circuit 900 does not include transistors P4 and P5. As a result, node ND210 is coupled to bit BL, the drain of PMOS transistor P2, the drain of NMOS transistor N0, and the gates of transistors P1 and P7. Similarly, node ND220 is coupled to bit BLB, the drain of PMOS transistors P3, the drain of NMOS transistor N1, and the gates of transistors P0 and P6. Effectively, PMOS transistors P2 and P3 increase voltages VGSN1 and VGSN0, respectively.

Figure 10A:
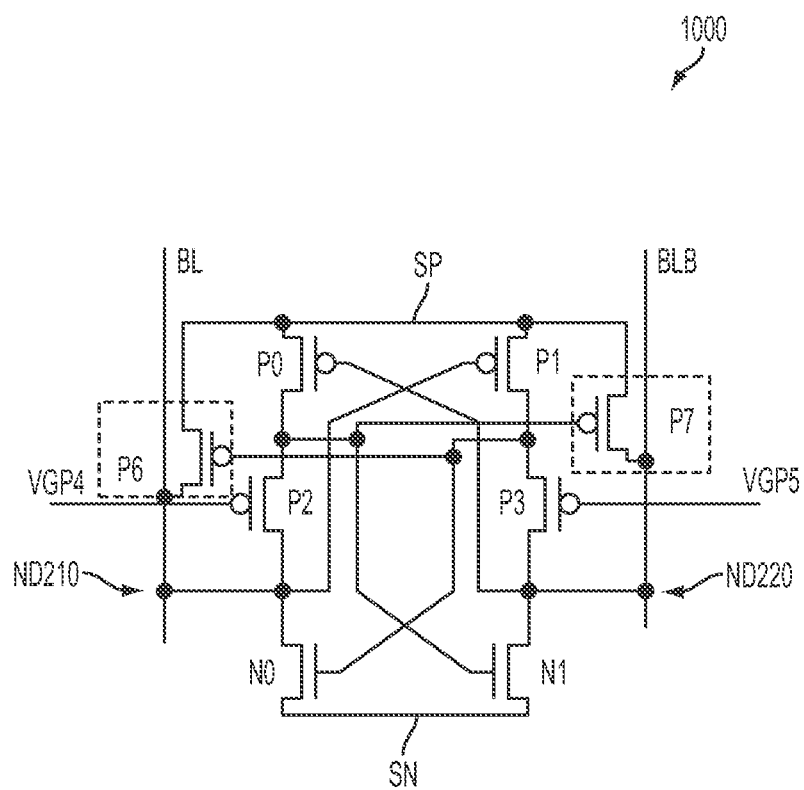

FIG. 10A is a diagram of a sense amplifier circuit 1000, in accordance with some embodiments. Circuit 1000 is another embodiment of sense amplifier circuit 105 in FIG. 1.

Compared with circuit 900, PMOS transistor P6 in circuit 1000 is coupled to other circuit elements in a different way than transistor P6 in circuit 900 being coupled to other circuit elements. For example, the gate of transistor P6 in FIG. 10A is coupled to the gate of transistor N0, the drain of transistor P1, and the source of transistor P3. Functionally, transistor P6 in FIG. 10A is also to pull node ND210 to voltage VDD of signal SP at the source of transistor P6. Similarly, compared with circuit 900, PMOS transistor P7 in circuit 1000 is coupled to other circuit elements in a different way than transistor P7 in circuit 900 being coupled to other circuit elements. For example, the gate of transistor P7 in FIG. 10A is coupled to the gate of transistor N1, the drain of transistor P0, and the source of transistor P2. Functionally, transistor P7 in FIG. 10A is also to pull node ND220 to voltage VDD of signal SP at the source of transistor P7.

Figure 10B:
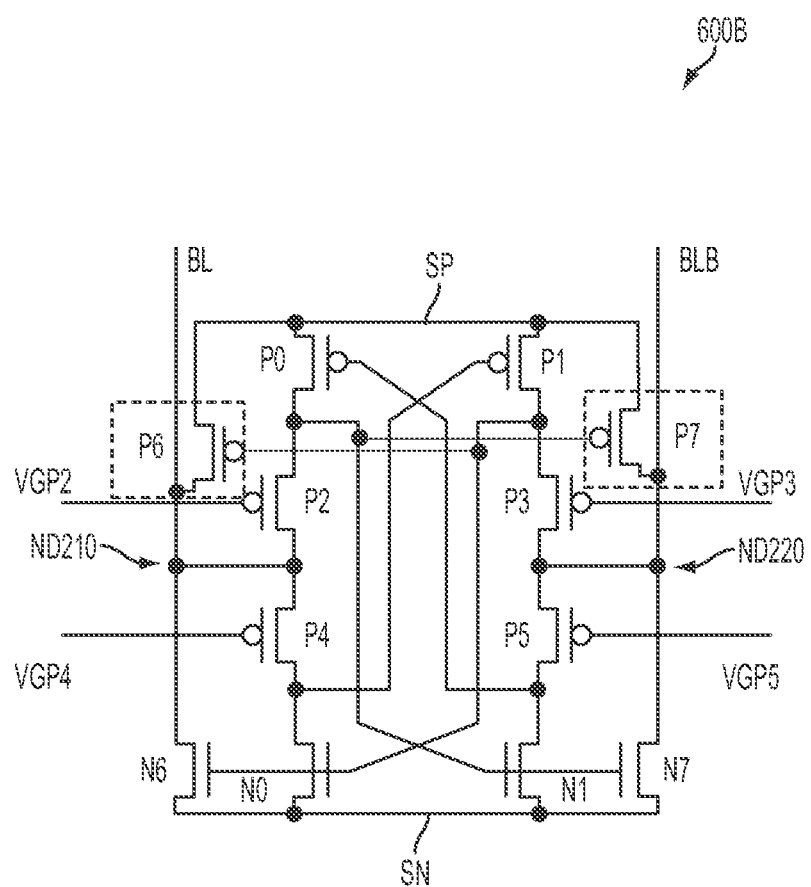

In some embodiments, the configurations of transistors P6 and P7 in FIG. 10A are used to replace the configurations of transistors P6 and P7 in circuit 600 of FIG. 6. A diagram of an example sense amplifier 600B, which is based on modifying circuit 600 of FIG. 6 according to this paragraph, is shown in FIG. 10B.

Figure 11:
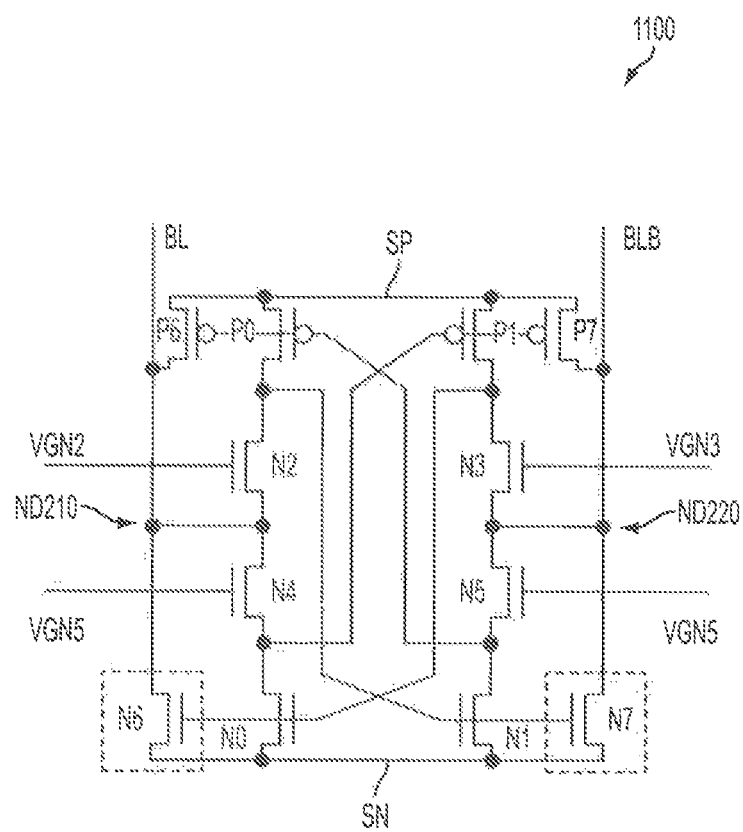

FIG. 11 is a diagram of a sense amplifier circuit 1100, in accordance with some embodiments. Circuit 1100 is another embodiment of sense amplifier circuit 105 in FIG. 1.

Compared with circuit 200 in FIG. 2, NMOS transistors N3, N3, N4, and N5 in circuit 1100 are used in place of resistors R3, R4, R1, and R2 in FIG. 2, respectively. Compared with circuit 600 in FIG. 6, NMOS transistors N2, N3, N4, and N5 in circuit 1100 are used in place of PMOS transistors P2, P3, P4, and P5 in FIG. 6, respectively.

Control voltages VGN2, VGN3, VGN4, and VGN5 are used in place of voltages VGP2, VGP3, VGP4, and VGP5 in FIG. 6, respectively. Effectively, NMOS transistors N4, N5, N2, and N3 are configured to increase voltages VGSP1, VGSP0, VGSN1, and VGSN0, respectively.

Transistors N6 and N7 are shown in the dotted boxes to indicate that, in some embodiments, transistors N6 and N7 are not used. In such a situation, NMOS transistors N4 and N0 are configured to pull node ND210 or bit line BL to voltage VSS of signal SN at the source of transistor N0. Similarly, NMOS transistors N5 and N1 are configured to pull node ND220 or bit line BLB to voltage VSS of signal SN at the source of transistor N1.

Figure 12:
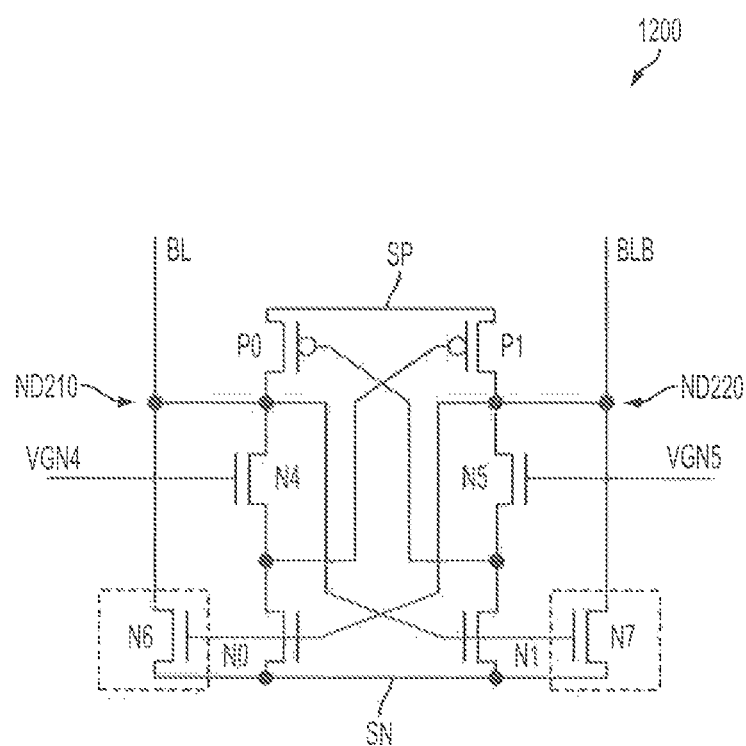

FIG. 12 is a diagram of a sense amplifier circuit 1200, in accordance with some embodiments. Circuit 1200 is another embodiment of sense amplifier circuit 105 in FIG. 1.

Compared with circuit 1100, circuit 1200 does not include transistors N2 and N3. As a result, node ND210 is coupled to bit BL, the drain of transistors P0, the drain of transistor N4, and the gates of transistors N1 and N7. Similarly, node ND220 is coupled to bit BLB, the drain of transistors P1, the drain of transistor N5, and the gates of transistors N0 and N6. Effectively, NMOS transistors N4 and N5 increase voltages VGSP1 and VGSP0, respectively.

Figure 13:
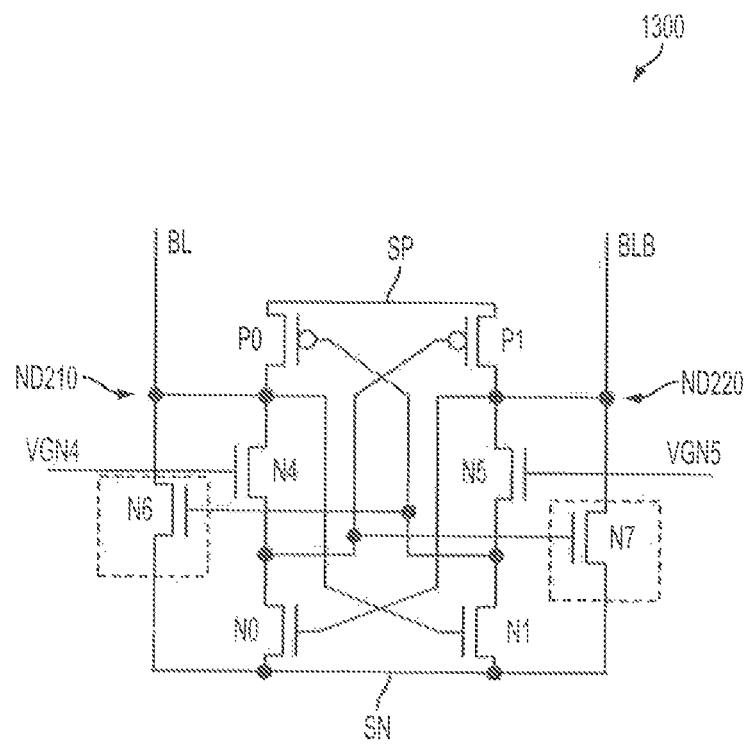

FIG. 13 is a diagram of a sense amplifier circuit 1300, in accordance with some embodiments. Circuit 1300 is another embodiment of sense amplifier circuit 105 in FIG. 1.

Compared with circuit 1200, NMOS transistor N6 in circuit 1300 is coupled to other circuit elements in a different way than NMOS transistor N6 in circuit 1200 being coupled to other circuit elements. For example, the gate of transistor N6 in FIG. 13 is coupled to the gate of transistor P0, the drain of transistor N1, and the source of transistor N5. Functionally, transistor N6 in FIG. 13 is to pull node ND210 to voltage VSS of signal SN at the source of transistor N6. Similarly, compared with circuit 1200, NMOS transistor N7 in circuit 1300 is coupled to other circuit elements in a different way than NMOS transistor N7 in circuit 1200 being coupled to other circuit elements. For example, the gate of transistor N7 in FIG. 13 is coupled to the gate of transistor P1, the drain of transistor N0, and the source of transistor N4. Functionally, transistor N7 in FIG. 13 is to pull node ND220 to voltage VSS of signal SN at the source of transistor N7.

In some embodiments, the configurations of transistors N6 and N7 in FIG. 13 are used to replace the configurations of transistors N6 and N7 in circuit 1100 of FIG. 11.

Figure 14:
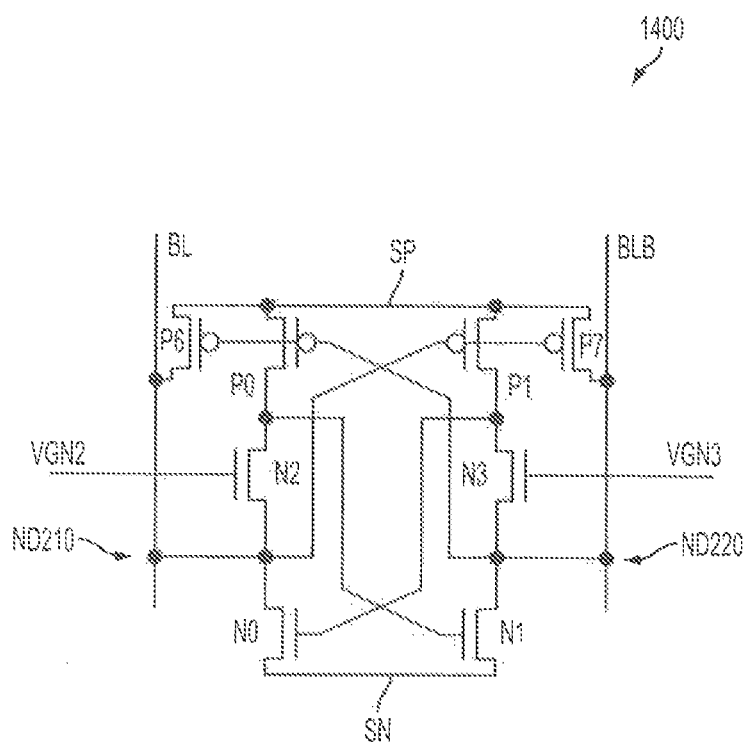

FIG. 14 is a diagram of a sense amplifier circuit 1400, in accordance with some embodiments. Circuit 1400 is another embodiment of sense amplifier circuit 105 in FIG. 1.

Compared with circuit 1100, circuit 1100 does not include transistors N4 and N5. As a result, node ND210 is coupled to bit BL, the source of NMOS transistor N2, the drain of NMOS transistor N0, and the gates of PMOS transistors P1 and P7. Similarly, node ND220 is coupled to bit BLB, the source of NMOS transistors N3, the drain of NMOS transistor N1, and the gates of PMOS transistors P0 and N6. Effectively, NMOS transistors N2 and N3 increase voltages VGSN1 and VGSN0 of transistors N1 and N0, respectively.

Figure 15:
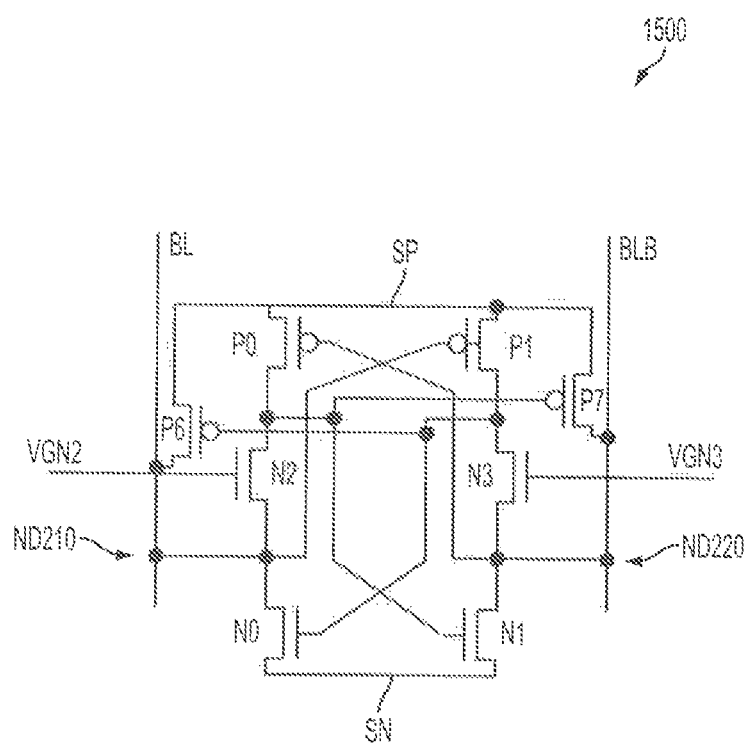

FIG. 15 is a diagram of a sense amplifier circuit 1500, in accordance with some embodiments. Circuit 1500 is another embodiment of sense amplifier circuit 105 in FIG. 1.

Compared with circuit 1400, PMOS transistor P6 in circuit 1500 is coupled to other circuit elements in a different way than transistor P6 in circuit 1400 being coupled to other circuit elements. For example, the gate of transistor P6 in FIG. 15 is coupled to the gate of NMOS transistor N0, the drain of PMOS transistor P1, and the drain of NMOS transistor N3. Functionally, transistor P6 in FIG. 15 is to pull node ND210 to voltage VDD of signal SP at the source of transistor P6. Similarly, compared with circuit 1400, PMOS transistor P7 in circuit 1500 is coupled to other circuit elements in a different way than transistor P7 in circuit 1400 being coupled to other circuit elements. For example, the gate of transistor P7 in FIG. 15 is coupled to the gate of transistor N1, the drain of PMOS transistor P0, and the drain of NMOS transistor N2. Functionally, transistor P7 in FIG. 15 is to pull node ND220 to voltage VDD of signal SP at the source of transistor P7.

In some embodiments, the configurations of transistors P6 and P7 in FIG. 15 are used to replace the configurations of transistors P6 and P7 in circuit 1100 of FIG. 11.

Figure 16:
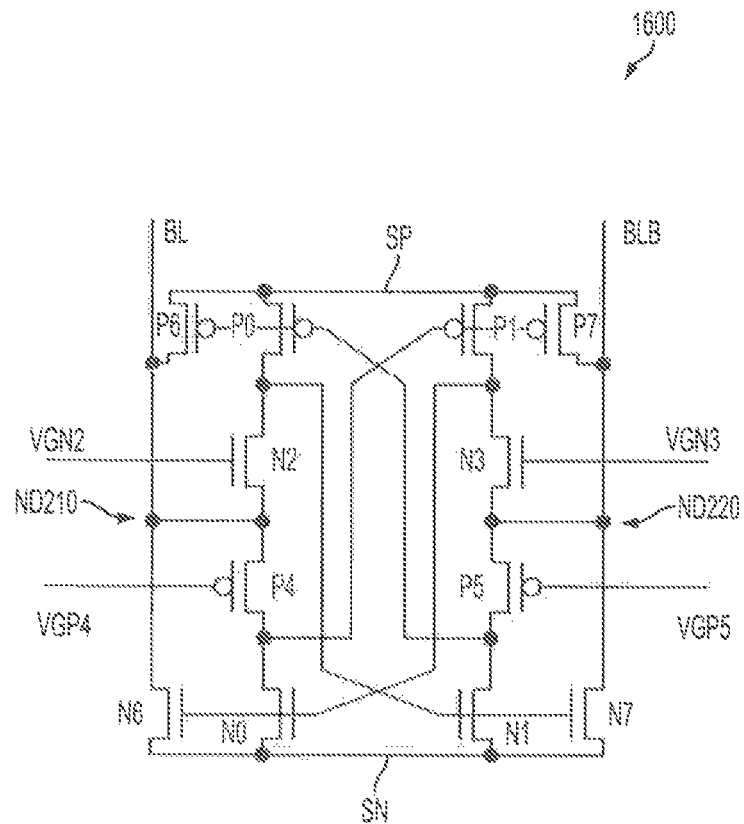

FIG. 16 is a diagram of a sense amplifier circuit 1600, in accordance with some embodiments. Circuit 1600 is another embodiment of sense amplifier circuit 105 in FIG. 1. Compared with circuit 600 in FIG. 6, NMOS transistors N2 and N3 in circuit 1600 are used in place of PMOS transistors P2 and P3 in circuit 600. Compared with circuit 1100 in FIG. 11, PMOS transistors P4 and P5 in circuit 1600 are used in place of NMOS transistors N4 and N5 in circuit 1100.

Figure 17:
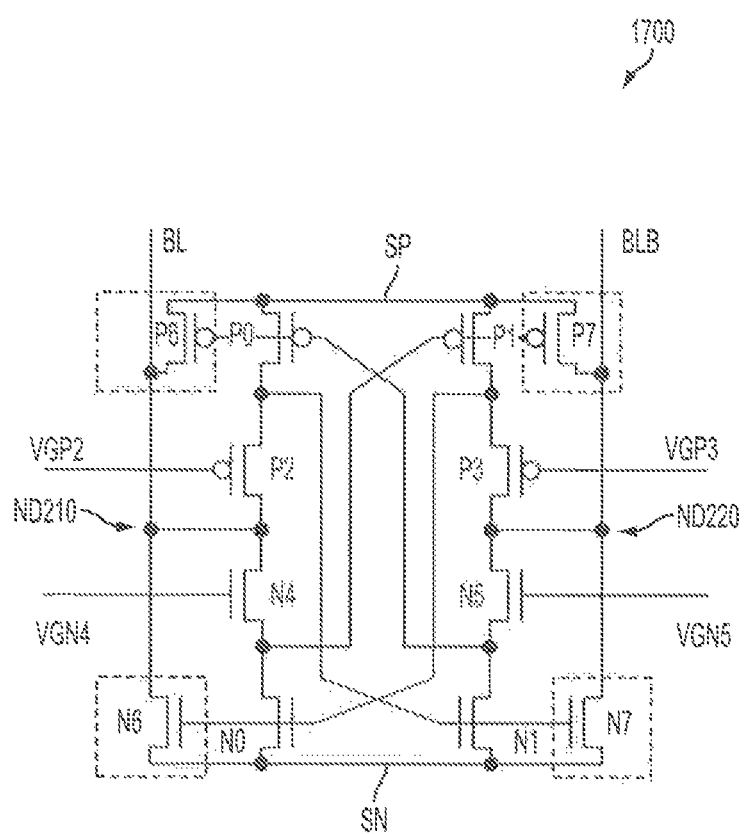

FIG. 17 is a diagram of a sense amplifier circuit 1700, in accordance with some embodiments. Circuit 1700 is another embodiment of sense amplifier circuit 105 in FIG. 1. Compared with circuit 600 in FIG. 6, NMOS transistors N4 and N5 in circuit 1700 are used in place of PMOS transistors P4 and P5 in circuit 600. Compared with circuit 1100 in FIG. 11, PMOS transistors P2 and P3 are used in place of NMOS transistors N2 and N3 in circuit 1100.

A number of embodiments have been described. It will nevertheless be understood that various modifications may be made without departing from the spirit and scope of the disclosure. For example, the various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low or high logic level of the various signals used in the above description is also for illustration purposes. Various embodiments are not limited to a particular level when a signal is activated and/or deactivated. Selecting different levels is within the scope of various embodiments.

In some embodiments, a sense amplifier circuit includes a first transistor, a second transistor, a third transistor, a fourth transistor, a fifth transistor, a sixth transistor, a first resistive device, and a second resistive device. The first transistor and the second transistor are transistors of a first type. The third transistor and the fourth transistor are transistors of a second type. A first end of the first resistive device is coupled to a first data line. A second end of the first resistive device is coupled to a drain of the third transistor and a gate of the second transistor. A first end of the second resistive device is coupled to a second data line. A second end of the second resistive device is coupled to a drain of the fourth transistor and a gate of the first transistor. A first terminal of the fifth transistor is coupled to a source of the third transistor. A second terminal of the fifth transistor is coupled to the first data line. A third terminal of the fifth transistor is coupled to the gate of the first transistor. A first terminal of the sixth transistor is coupled to a source of the fourth transistor. A second terminal of the sixth transistor is coupled to the second data line. A third terminal of the sixth transistor is coupled to the gate of the second transistor.

In some embodiments, a sense amplifier circuit includes a first p-channel metal-oxide semiconductor (PMOS) transistor, a second PMOS transistor, a first n-channel metal-oxide semiconductor (NMOS) transistor, a second NMOS transistor, a first current transmission device coupled between the first PMOS transistor and the first NMOS transistor, a second current transmission device coupled between the second PMOS transistor and the second NMOS transistor, a third PMOS transistor, and a fourth PMOS transistor. A source of the first PMOS transistor is coupled to a source of the second PMOS transistor and is configured to receive a first voltage value. A drain of the first PMOS transistor is coupled to a gate of the second NMOS transistor. A gate of the first PMOS transistor is coupled to a drain of the second NMOS transistor. A source of the first NMOS transistor is coupled to a source of the second NMOS transistor and is configured to receive a second voltage value. A drain of the second PMOS transistor is coupled to a gate of the first NMOS transistor. A gate of the second PMOS transistor is coupled to a drain of the first NMOS transistor. A source of the third PMOS transistor is coupled to the source of the first PMOS transistor. A drain of the third PMOS transistor is coupled to a first data line. A gate of the third PMOS transistor is coupled to the gate of the first NMOS transistor. A source of the fourth PMOS transistor is coupled to the source of the second PMOS transistor. A drain of the fourth PMOS transistor is coupled to a second data line. A gate of the fourth PMOS transistor is coupled to the gate of the second NMOS transistor.

In some embodiments, a sense amplifier circuit includes a first p-channel metal-oxide semiconductor (PMOS) transistor, a second PMOS transistor, a first n-channel metal-oxide semiconductor (NMOS) transistor, a second NMOS transistor, a first current transmission device coupled between the first PMOS transistor and the first NMOS transistor, a second current transmission device coupled between the second PMOS transistor and the second NMOS transistor, a third NMOS transistor, and a fourth NMOS transistor. A source of the first PMOS transistor is coupled to a source of the second PMOS transistor and is configured to receive a first voltage value. A drain of the first PMOS transistor is coupled to a gate of the second NMOS transistor. A gate of the first PMOS transistor is coupled to a drain of the second NMOS transistor. A source of the first NMOS transistor is coupled to a source of the second NMOS transistor and is configured to receive a second voltage value. A drain of the second PMOS transistor is coupled to a gate of the first NMOS transistor. A gate of the second PMOS transistor is coupled to a drain of the first NMOS transistor. A source of the third NMOS transistor is coupled to the source of the first NMOS transistor. A drain of the third NMOS transistor is coupled to a first data line. A gate of the third NMOS transistor is coupled to the gate of the first PMOS transistor. A source of the fourth NMOS transistor is coupled to the source of the second NMOS transistor. A drain of the fourth NMOS transistor is coupled to a second data line. A gate of the fourth NMOS transistor is coupled to the gate of the second PMOS transistor.

In various embodiments, a transistor functions as a switch. A switching circuit used in place of a transistor is within the scope of various embodiments.

The various figures show the resistor circuits using discrete resistors for illustration. Equivalent circuitry may be used. For example, a resistive device, circuitry or network, such as a combination of resistors, resistive devices, circuitry, etc., can be used in place of the resistor.

The above methods show exemplary steps, but the steps are not necessarily performed in the order shown. Steps may be added, replaced, changed order, and/or eliminated as appropriate, in accordance with the spirit and scope of disclosed embodiments.

What is claimed is:

1. A sense amplifier circuit, comprising:
   a first transistor and a second transistor, the first transistor and the second transistor being transistors of a first type;
   a third transistor and a fourth transistor, the third transistor and the fourth transistor being transistors of a second type;
   a first resistive device;
   a second resistive device;
   a fifth transistor; and
   a sixth transistor,
   wherein
      a first end of the first resistive device is coupled to a first data line;
      a second end of the first resistive device is coupled to a drain of the third transistor and a gate of the second transistor;
      a first end of the second resistive device is coupled to a second data line;

a second end of the second resistive device is coupled to a drain of the fourth transistor and a gate of the first transistor;
a first terminal of the fifth transistor is coupled to a source of the third transistor;
a second terminal of the fifth transistor is coupled to the first data line;
a third terminal of the fifth transistor is coupled to the gate of the first transistor;
a first terminal of the sixth transistor is coupled to a source of the fourth transistor;
a second terminal of the sixth transistor is coupled to the second data line; and
a third terminal of the sixth transistor is coupled to the gate of the second transistor.

2. The sense amplifier circuit of claim 1, wherein
the sense amplifier circuit further comprises a third resistive device;
a first end of the third resistive device is coupled to the first data line and the first end of the first resistive device;
a second end of the third resistive device is coupled to the drain of the first transistor and the gate of the fourth transistor;
the sense amplifier circuit further comprises a fourth resistive device;
a first end of the fourth resistive device is coupled to the second data line and the first end of the second resistive device; and
a second end of the fourth resistive device is coupled to the drain of the second transistor and the gate of the third transistor.

3. The sense amplifier circuit of claim 2, wherein
the first resistive device, the second resistive device, the third resistive device, and the fourth resistive device are each a transistor.

4. The sense amplifier circuit of claim 1, wherein
the first resistive device and the second resistive device are each a transistor of the first type; or
the first resistive device and the second resistive device are each a transistor of the second type.

5. The sense amplifier circuit of claim 1, wherein
the first transistor and the second transistor are each a p-channel metal-oxide semiconductor (PMOS) transistor, and the third transistor and the fourth transistor are each an n-channel metal-oxide semiconductor (NMOS) transistor; or
the first transistor and the second transistor are each an NMOS transistor, and the third transistor and the fourth transistor are each a PMOS transistor.

6. The sense amplifier circuit of claim 1, wherein
each of the first transistor and the second transistor is a PMOS transistor, and each of the third transistor and the fourth transistor is an NMOS transistor; or each of the first transistor and the second transistor is an NMOS transistor, and each of the third transistor and the fourth transistor is a PMOS transistor; and
the first resistive device and the second resistive device are each a PMOS transistor or are each an NMOS transistor.

7. A sense amplifier circuit, comprising:
a first p-channel metal-oxide semiconductor (PMOS) transistor;
a second PMOS transistor;
a first n-channel metal-oxide semiconductor (NMOS) transistor;
a second NMOS transistor;
a first current transmission device coupled between the first PMOS transistor and the first NMOS transistor;
a second current transmission device coupled between the second PMOS transistor and the second NMOS transistor;
a third PMOS transistor; and
a fourth PMOS transistor, wherein
a source of the first PMOS transistor is coupled to a source of the second PMOS transistor and is configured to receive a first voltage value;
a drain of the first PMOS transistor is coupled to a gate of the second NMOS transistor;
a gate of the first PMOS transistor is coupled to a drain of the second NMOS transistor;
a source of the first NMOS transistor is coupled to a source of the second NMOS transistor and is configured to receive a second voltage value;
a drain of the second PMOS transistor is coupled to a gate of the first NMOS transistor;
a gate of the second PMOS transistor is coupled to a drain of the first NMOS transistor;
a source of the third PMOS transistor is coupled to the source of the first PMOS transistor;
a drain of the third PMOS transistor is coupled to a first data line;
a gate of the third PMOS transistor is coupled to the gate of the first NMOS transistor;
a source of the fourth PMOS transistor is coupled to the source of the second PMOS transistor;
a drain of the fourth PMOS transistor is coupled to a second data line; and
a gate of the fourth PMOS transistor is coupled to the gate of the second NMOS transistor.

8. The sense amplifier circuit of claim 7, wherein
the first and the second current transmission devices are each a resistive device;
the drain of the first PMOS transistor is coupled to the first data line; and
the drain of the second PMOS transistor is coupled to the second data line.

9. The sense amplifier circuit of claim 7, wherein
the first and the second current transmission devices are each a resistive device;
the drain of the first NMOS transistor is coupled to the first data line; and
the drain of the second NMOS transistor is coupled to the second data line.

10. The sense amplifier circuit of claim 7, wherein
the first current transmission device comprises a fifth PMOS transistor; and
the second current transmission device comprises a sixth PMOS transistor.

11. The sense amplifier circuit of claim 7, wherein
the first current transmission device comprises a third NMOS transistor; and
the second current transmission device comprises a fourth NMOS transistor.

12. The sense amplifier circuit of claim 7, wherein
the first current transmission device comprises two transistors connected in series; and
the second current transmission device comprises another two transistors connected in series.

13. The sense amplifier circuit of claim 12, wherein
the two transistors of the first current transmission device are electrically coupled together at a first node, and the first node being electrically coupled to the first data line; and the another two transistors of the second current transmission device are electrically coupled together at a second node, and the second node being electrically coupled to the second data line.

14. A sense amplifier circuit, comprising:
a first p-channel metal-oxide semiconductor (PMOS) transistor;
a second PMOS transistor;
a first n-channel metal-oxide semiconductor (NMOS) transistor;
a second NMOS transistor;
a first current transmission device coupled between the first PMOS transistor and the first NMOS transistor;
a second current transmission device coupled between the second PMOS transistor and the second NMOS transistor;
a third NMOS transistor; and
a fourth NMOS transistor, wherein
 a source of the first PMOS transistor is coupled to a source of the second PMOS transistor and is configured to receive a first voltage value;
 a drain of the first PMOS transistor is coupled to a gate of the second NMOS transistor;
 a gate of the first PMOS transistor is coupled to a drain of the second NMOS transistor;
 a source of the first NMOS transistor is coupled to a source of the second NMOS transistor and is configured to receive a second voltage value;
 a drain of the second PMOS transistor is coupled to a gate of the first NMOS transistor;
 a gate of the second PMOS transistor is coupled to a drain of the first NMOS transistor;
 a source of the third NMOS transistor is coupled to the source of the first NMOS transistor;
 a drain of the third NMOS transistor is coupled to a first data line;
 a gate of the third NMOS transistor is coupled to the gate of the first PMOS transistor;
 a source of the fourth NMOS transistor is coupled to the source of the second NMOS transistor;
 a drain of the fourth NMOS transistor is coupled to a second data line; and
 a gate of the fourth NMOS transistor is coupled to the gate of the second PMOS transistor.

15. The sense amplifier circuit of claim 14, wherein
the first and the second current transmission devices are each a resistive device;
the drain of the first PMOS transistor is coupled to the first data line; and
the drain of the second PMOS transistor is coupled to the second data line.

16. The sense amplifier circuit of claim 14, wherein
the first and the second current transmission devices are each a resistive device;
the drain of the first NMOS transistor is coupled to the first data line; and
the drain of the second NMOS transistor is coupled to the second data line.

17. The sense amplifier circuit of claim 14, wherein
the first current transmission device comprises a third PMOS transistor; and
the second current transmission device comprises a fourth PMOS transistor.

18. The sense amplifier circuit of claim 14, wherein
the first current transmission device comprises a fifth NMOS transistor; and
the second current transmission device comprises a sixth NMOS transistor.

19. The sense amplifier circuit of claim 14, wherein
the first current transmission device comprises two transistors connected in series; and
the second current transmission device comprises another two transistors connected in series.

20. The sense amplifier circuit of claim 19, wherein
the two transistors of the first current transmission device are electrically coupled together at a first node, and the first node being electrically coupled to the first data line; and
the another two transistors of the second current transmission device are electrically coupled together at a second node, and the second node being electrically coupled to the second data line.

* * * * *